(12) United States Patent
Watanabe et al.

(10) Patent No.: US 6,171,394 B1
(45) Date of Patent: Jan. 9, 2001

(54) METHOD FOR MANUFACTURING COMPOUND SEMICONDUCTOR EPITAXIAL WAFER

(75) Inventors: Masataka Watanabe, Gunma-ken; Tsuneyuki Kaise; Masayuki Shinohara, both of Annaka, all of (JP)

(73) Assignee: Shin-Etsu Handotai Co., Ltd., Tokyo (JP)

( * ) Notice: Under 35 U.S.C. 154(b), the term of this patent shall be extended for 0 days.

(21) Appl. No.: 09/081,662

(22) Filed: May 20, 1998

(30) Foreign Application Priority Data

May 27, 1997 (JP) .................................. 9-152947
Dec. 19, 1997 (JP) .................................. 9-365057

(51) Int. Cl.$^7$ ................................................ C30B 25/14
(52) U.S. Cl. ............................ 117/89; 117/102; 117/103
(58) Field of Search .................. 117/84, 86, 89, 117/104, 108, 101, 85, 107, 83, 953, 954, 955, 102, 103

(56) References Cited

U.S. PATENT DOCUMENTS

| | | |
|---|---|---|
| 3,942,065 | 3/1976 | Russ . |
| 4,510,515 * | 4/1985 | Kajita et al. ............................ 357/17 |
| 4,865,655 * | 9/1989 | Fujita et al. . |
| 4,942,439 * | 7/1990 | Schairer .................................. 357/17 |
| 4,968,642 * | 11/1990 | Fujita et al. ........................... 437/128 |
| 5,077,587 * | 12/1991 | Albergo et al. ........................ 357/17 |
| 5,194,922 | 3/1993 | Moser . |
| 5,521,397 * | 5/1996 | Zhang ..................................... 257/17 |
| 5,606,180 * | 2/1997 | Hosoi et al. ............................. 257/86 |
| 5,660,628 * | 8/1997 | Sato et al. ............................... 117/84 |
| 5,735,950 * | 4/1998 | Cunningham et al. ................ 117/85 |
| 5,744,828 * | 4/1998 | Nozaki et al. .......................... 257/94 |
| 5,759,264 * | 6/1998 | Watanabe et al. ..................... 117/101 |
| 5,856,208 | 1/1999 | Sato et al. . |

FOREIGN PATENT DOCUMENTS

| | | |
|---|---|---|
| 196 22 704 | 12/1996 | (DE) . |
| WO 97 25747 | 7/1997 | (WO) . |

* cited by examiner

Primary Examiner—Benjamin L. Utech
Assistant Examiner—Matthew Anderson
(74) Attorney, Agent, or Firm—Snider & Associates; Ronald R. Snider

(57) ABSTRACT

A method for manufacturing compound semiconductor epitaxial wafer allowing sharp changes in alloy composition and growth of high-quality epitaxial layers. In a process for epitaxially growing a gallium arsenide phosphide $GaAs_{1-x}P_x$ alloy composition gradient layer 4 on a compound semiconductor single-crystalline substrate made of gallium phosphide GaP or gallium arsenide GaAs, one group V gas as a source for the group V element not composing the single-crystalline substrate is varied in its supply volume in at least one cycle of sharp increase/moderate decrease, while the other group V gas as a source for the group V element composing the single-crystalline substrate is moderately decreased, thereby achieving at least one cycle of sharp increase/moderate decrease of a product of partial pressures of the group III and group V gases so that at least one set of an increasing zone and a decreasing zone of the alloy composition is formed within the gallium arsenide phosphide $GaAs_{1-x}P_x$ alloy composition gradient layer 4.

17 Claims, 5 Drawing Sheets

METHOD FOR MANUFACTURING COMPOUND SEMICONDUCTOR EPITAXIAL WAFER

This disclosure relates to subject matter contained in Japanese patent application No. 152947/1997 (filed on May 27, 1997) and in No. 365057/1997 (filed on Dec. 19, 1997) Applicant hereby claims the priority of patent application 152947/1997 and patent application 365057/1997.

BACKGROUND OF THE INVENTION

1. Field of the Invention

This invention relates to a method for manufacturing compound semiconductor epitaxial wafer, more particularly to a method for manufacturing compound semiconductor epitaxial wafer having an alloy composition gradient layer.

2. Description of the Prior Art

In a field of manufacturing red light emitting diode or those emit orange or yellow lights, generally used is a compound semiconductor epitaxial wafer composing a single-crystalline substrate made of gallium phosphide GaP or gallium arsenide GaAs on which an alloy composition constant layer made of gallium arsenide phosphide $GaAs_{1-a}P_a$ (where, "a" represents a real number satisfying $0 \leq a \leq 1$) in which GaAs and GaP, the III-V compound semiconductors not being comprised in the single-crystalline substrate, conform with predetermined alloy compositions of "1-a" and "a", respectively. Emission wavelength is determined by the alloy composition "a", which is typified by a=0.9 for yellow light emitting diode, a=0.65 for orange light and a=0.57 for red light, when a gallium phosphide GaP single-crystalline substrate is used.

When a relatively large lattice mismatch is produced between the compound semiconductor single-crystalline substrate made of gallium phosphide GaP or gallium arsenide GaAs and the $GaAs_{1-a}P_a$ alloy composition constant layer grown thereon, misfit dislocation will occur at the interface to relax the stress due to the lattice mismatch.

The dislocation, however, will be causative of degrading luminous efficiency of a light emitting diode if it extends to the alloy composition constant layer where an emission region is formed.

General solution for preventing the misfit dislocation from extending is to interpose, between the single-crystalline substrate and the $GaAs_{1-a}P_a$ alloy composition constant layer, a $GaAs_{1-x}P_x$ alloy composition gradient layer in which an alloy composition "1-x" of gallium arsenide GaAs and an alloy composition "x" of gallium phosphide GaP vary in a gradual manner. As a method for forming such alloy composition gradient layer, it is known to make gradual changes in a composition of a source gas fed into an environment for growing the alloy composition gradient layer, as well as making changes in vapor phase growth temperature (Japanese Patent Laid Open Showa 49-11468).

Here, the change in the vapor phase growth temperature is intended for improving a crystallinity of the $GaAs_{1-x}P_x$ alloy composition gradient layer. In a process of generating the compositional variation of the alloy composition gradient layer from that of the single-crystalline substrate toward that of the $GaAs_{1-a}P_a$ alloy composition constant layer accompanying with epitaxial growth, that is, to make a GaAsP layer epitaxially grown on a GaP substrate while increasing a compositional ratio of As in the source gas, the vapor phase growth temperature will be gradually lowered when the alloy composition "1-x" of gallium arsenide GaAs is raised. On the contrary, the vapor phase growth temperature will be gradually elevated when the alloy composition "x" of gallium phosphide GaP is raised, that is, to make a GaAsP layer epitaxially grown on a GaAs substrate while increasing a compositional ratio of P in the source gas.

After a series of research and development for blocking extension of the misfit dislocation toward the $GaAs_{1-a}P_a$ alloy composition constant layer and for effectively relaxing the stress due to lattice mismatch within the epitaxial layer, the present inventors have previously found out that it was preferable to make the alloy composition be sharply increased during epitaxial growth of the alloy composition gradient layer and, immediately after that, to make the alloy composition be partially recovered at a moderate A rate (Japanese Patent Application Heisei 8-22029), which is totally opposed to the conventional method producing gradual changes in alloy composition as has been believed in common.

It was, however, made clear that an attempt to make sharp changes in vapor phase growth temperature corresponding to variation in the alloy composition, while making sharp changes also in the composition of a source gas containing group V elements in the periodic table (simply referred as group V source gas hereinafter) to be fed, to obtain the alloy composition gradient layer internally having sharp changes in the alloy composition, would often result in failure because of a large thermal capacity of a susceptor on which a substrate is placed, and a limited heat transmission rate from the susceptor to the substrate.

Instantaneous excessive heating and cooling to achieve drastic changes in the vapor phase growth temperature will result in slip dislocation more easily to degrade the crystal quality.

SUMMARY OF THE INVENTION

To solve the foregoing problems, the object of the present invention is to provide a method for manufacturing compound semiconductor epitaxial wafer that allows sharp changes in the alloy composition while ensuring growth of a high quality epitaxial layer.

Accordingly the first aspect of the present invention, in a method for manufacturing compound semiconductor epitaxial wafer composing: a single-crystalline substrate made of gallium phosphide GaP or gallium arsenide GaAs; an alloy composition constant layer made of gallium arsenide phosphide $GaAs_{1-a}P_a$ (where, "1-a" represents alloy composition of gallium arsenide GaAs, and "a" represents alloy composition of gallium phosphide GaP and satisfies a relation of $0 \leq a \leq 1$); and an alloy composition gradient layer made of gallium arsenide phosphide $GaAs_{1-x}P_x$ (where, "1-x" represents alloy composition of gallium arsenide GaAs, and "x" represents alloy composition of gallium phosphide GaP and satisfies a relation of $0 \leq x \leq 1$) interposed between the single-crystalline substrate and the alloy composition constant layer, wherein the alloy composition gradient layer is epitaxially grown using a group III gas as a gallium Ga source and group V gases as arsenic As and phosphorus P sources, one of group V gases as a source for the group V element composing the single-crystalline substrate being gradually reduced as a whole in its supply volume, the other group V gas as a source for the group V element not composing the single-crystalline substrate being varied in its supply volume in at least one cycle of sharp increase/moderate decrease, thereby achieving at least one cycle of sharp increase/moderate decrease of a product of a partial pressure of the group III gas and a total of the partial pressures of the group V gases so that at least one set of an increasing zone and a decreasing zone of the alloy composition "1-x" or "x" is formed in the direction of the growth of the alloy composition gradient layer.

In accordance with the second aspect of the present invention, there is provided a method for manufacturing compound semiconductor epitaxial wafer wherein the supply volume of the group V gas as a source of the group V element composing the single-crystalline substrate is kept constant during a sharp increase in the supply volume of the group V gas as a source of the group V element not composing the single-crystalline substrate.

In accordance with the third aspect of the present invention, there is provided a method for manufacturing compound semiconductor epitaxial wafer wherein, at least during the period in which the supply volume of the group V gas is varied, the vapor phase growth temperature of the alloy composition gradient layer made of gallium arsenide phosphide $GaAs_{1-x}P_x$ is gradually lowered when the epitaxial growth is effected on the single-crystalline substrate made of gallium phosphide GaP, and gradually elevated when it is effected on the single-crystalline substrate made of gallium arsenide GaAs.

In accordance with the fourth aspect of the present invention, there is provided a method for manufacturing compound semiconductor epitaxial wafer, wherein an increasing rate of the alloy composition "1-x" or "x" in the increasing zone per 1 µm of epitaxial growth thickness is set between 0.1 to 20, both ends inclusive, and a decreasing rate of the alloy composition "1-x" or "x" in the decreasing zone per 1 µm of epitaxial growth thickness is set between 0.005 to 0.05, both ends inclusive.

In accordance with the fifth aspect of the present invention, there is provided a method for manufacturing compound semiconductor epitaxial wafer, wherein thickness of the one set of the alloy composition increasing zone and decreasing zone is set between 1 to 10 µm, both ends inclusive.

In accordance with the sixth aspect of the present invention, there Is provided a method for manufacturing compound semiconductor epitaxial wafer, wherein an alloy composition adjusting zone is formed in the final stage of growing the alloy composition gradient layer, so that the alloy composition "1-x" or "x" is ultimately equalized to the alloy composition "1-a" or "a", respectively.

The present invention allows sharp changes in the alloy composition. In the method for manufacturing compound semiconductor epitaxial wafer of the present invention, a supply volume of a source gas providing the group V element not contained in a compound semiconductor single-crystalline substrate is sharply increased to cause a jump-up of the product of the partial pressures of the group III and the group V gases, which enables to form, within an alloy composition gradient layer made of gallium arsenide phosphide $GaAs_{1-x}P_x$, an alloy composition increasing zone exhibiting a sharp increase in the alloy composition, the sharpness of which having never been followed simply by controlling the growth temperature.

Since at least one cycle of sharp increase and moderate decrease in the supply volume of a source gas providing the group V element not contained in a compound semiconductor single-crystalline substrate is effected while moderately decreasing the supply volume of a source gas providing the group V element contained in the compound semiconductor single-crystalline substrate, the product of the partial pressures of the group III and the group V gases is allowed to sharply increase and then moderately decrease, so that an alloy composition gradient layer is formed with a high efficiency, which results in a efficient growth of a high quality epitaxial layer.

BRIEF DESCRIPTION OF THE DRAWINGS

The above and other objects, features and advantages of the present invention will be apparent from a consideration of the following description, taken in connection with the accompanying drawings in which.

DETAILED DESCRIPTION OF THE PREFERRED EMBODIMENT

The present invention will be detailed in connection with a preferred embodiment.

Figure 6:
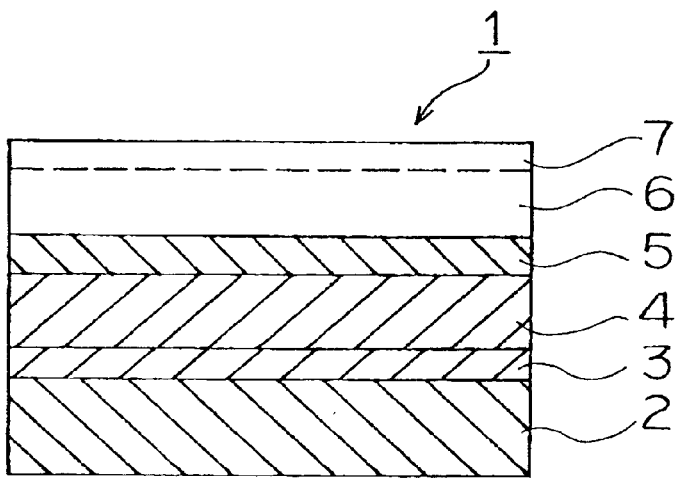
FIG. 6 shows a schematic sectional view for explaining one example of a composition of an epitaxial wafer in relation to the present invention.

A compound semiconductor epitaxial wafer 1 manufactured according to the present invention comprises, as shown in FIG. 6, an n-type gallium phosphide GaP single-crystalline substrate 2, and successively deposited thereon an n-type gallium phosphide GaP epitaxial layer 3, an n-type gallium arsenide phosphide GaAs,-,P, alloy composition gradient layer 4 in which the alloy composition "1-x" (where, 0≦x≦1) of gallium arsenide GaAs, a III-V compound semiconductor not composing the substrate, varies (increases or decreases) along the direction of the epitaxial growth, and an n-type gallium arsenide phosphide $GaAs_{1-a}P_a$ alloy composition constant layer 5 having a constant alloy composition "1-a" (where, 0≦a≦1) of gallium arsenide GaAs, in this order; and further formed thereon in such an order a nitrogen(N)-doped n-type gallium arsenide phosphide $GaAs_{1-x}P_a$ alloy composition constant layer 6 having a constant alloy composition "1-a", and a p-type diffusion layer 7 formed by diffusing a p-type impurity into the surface of the $GaAs_{1-x}P_a$ alloy composition constant layer 6.

Such epitaxial wafer 1 is attached with electrodes, diced into a proper size and enclosed in a package to be finished as a light emitting diode.

Whereas the above description relates to a case that a single-crystalline substrate 2 is made of gallium phosphide GaP, the same will apply to a gallium arsenide GaAs substrate. When the gallium arsenide GaAs substrate is used, a gallium arsenide phosphide $GaAs_{1-x}P_x$ alloy composition gradient layer 4 in which the alloy composition "x" (where, $0 \leq x \leq 1$) of gallium phosphide GaP varies (increases or decreases) along the direction of the epitaxial growth is grown thereon, and further the gallium arsenide phosphide $GaAs_{1-a}P_a$ alloy composition constant layer 5 having a constant alloy composition "a" (where, $0 \leq a \leq 1$) of gallium phosphide GaP is formed.

The following paragraphs describe a method for manufacturing compound semiconductor epitaxial wafer 1 in accordance with the present invention referring to graphs as shown in FIGS. 1 to 4. These drawings depict changes in each parameter observed in a vapor phase growth of the gallium arsenide phosphide $GaAs_{1-x}P_x$ alloy composition gradient layer 4. The ordinates in the individual drawings stand for flow rate of the group V gas per se, that is, excluding diluent volume of hydrogen for FIG. 1, III.V partial pressure product for FIG. 2, vapor phase growth temperature for FIG. 3, and alloy composition "1-x" of gallium arsenide GaAs for FIG. 4. Abscissae in the individual drawings commonly stand for growth thickness of the epitaxial layer.

First, a gallium phosphide GaP epitaxial layer 3 is grown from a vapor phase onto a gallium phosphide GaP single-crystalline substrate 2 to the thickness $d_{10}$. On the gallium phosphide GaP epitaxial layer 3, a gallium arsenide phosphide $GaAs_{1-x}P_x$ alloy composition gradient layer 4, having an alloy composition "1-x" of gallium arsenide GaAs variable from 0 up to "1-a" in the direction of the epitaxial growth, is then vapor-phase grown to a thickness $(d_{16}-d_{10})$.

The above gallium arsenide phosphide $GaAs_1-P_x$ alloy composition gradient layer 4 further comprises alloy composition increasing zones R11, R12 and R13 where the alloy composition "1-x" of gallium arsenide GaAs is increased steeply, and alloy composition decreasing zones S11 and S12 where the alloy composition "1-x" is moderately decreased to an extent the previous increment of the ratio "1-x" of gallium arsenide GaAs is not fully offset.

The number of repetition of such combination of the alloy composition increasing and decreasing zones (R11 and S11, and R12 and S12) is determined by a predetermined value of alloy composition "1-a" and increasing/decreasing rate of alloy composition "1-x". The combination of the increasing and decreasing zones occurs at least once in the direction of epitaxial growth within the alloy composition gradient layer 4.

The uppermost area of the alloy composition gradient layer 4 may be composed of an alloy composition adjusting layer A13. An alloy composition in the alloy composition adjusting layer A13 is so set that it may be retained at (1-x)=(1-a) if the alloy composition "1-x" of gallium arsenide GaAs has already reached (1-a) in the alloy composition gradient layer 4 after undergoing a predetermined number of cycles of the increase and decrease, but it will be moderately increased up to "1-a" if it is still a little shorter than "1-a". In an example shown in the drawings, alloy composition "1-x" of gallium arsenide GaAs in the alloy composition gradient layer 4 is already brought to "1-a" at the point that the growth of the alloy composition increasing zone R13 is completed, so that alloy composition of gallium arsenide GaAs in the alloy composition adjusting zone A13 is maintained at (1-x)=(1-a).

In a process of the epitaxial growth of the alloy composition gradient layer 4, the alloy composition increasing zones Rll and R12 can produce misfit dislocation to efficiently and locally relax stress being caused by lattice mismatch and being distributed along the epitaxial growth thickness, and the alloy composition decreasing zones S11 and S12 can repair the crystal impaired by the misfit dislocation, which results in production of an epitaxial wafer with less warpage and a good crystallinity. The sharp increase in the alloy composition in the alloy composition increasing zones R11 and R12 is also beneficial in terms of efficient production of a compound semiconductor epitaxial wafer because it allows only a small thickness of the alloy composition gradient layer 4 can suffice.

Now, the sharp increase in the alloy composition "1-x" of gallium arsenide GaAs along the direction of the epitaxial growth of alloy composition increasing zones R11, R12 and R13 within the gallium arsenide phosphide $GaAs_{1-x}P_x$ alloy composition gradient layer 4 requires sharp changes in the composition of the source gas.

Although a number of ways is supposed to make changes in the source gas composition to effect sharp changes in the alloy composition "1-x" of gallium arsenide GaAs, such as raising the supply volume of arsenic As source gas independently, or such as concomitantly making a sharp increase in the supply volume of arsenic As source gas and a sharp decrease in that of phosphorus P source gas, it is anyhow critical to follow a certain condition to achieve a satisfiable crystal quality and a good reproducibility.

Through a series of laboratory experiments, the present inventors have observed various states of crystals having a variety of alloy composition by changing supply composition of the source gases and the vapor phase growth temperature. The results suggested that a favorable and reproducible surface quality of the epitaxial layer is obtained when the conditions shown in FIG. 5 are satisfied.

Figure 5:
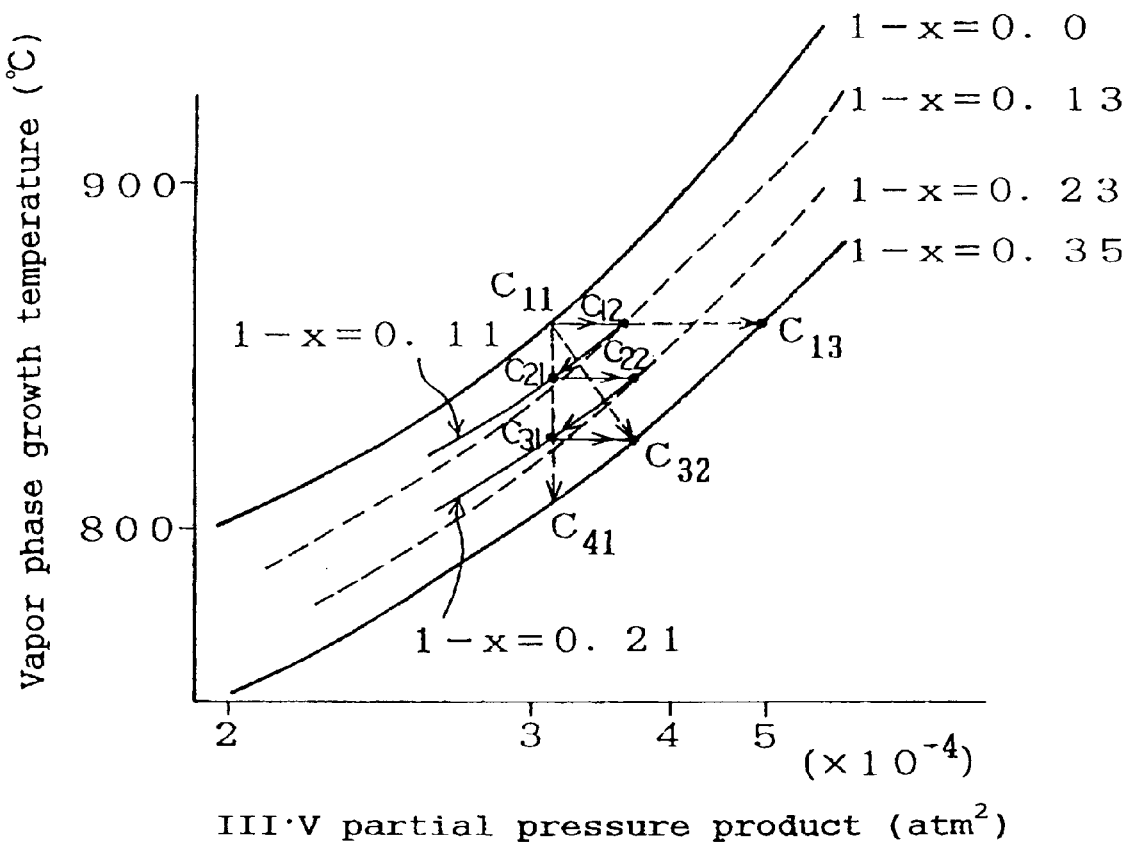
FIG. 5 shows a graph for explaining interrelations among the III.V partial pressure product and the alloy composition "1-x" of gallium arsenide GaAs and the vapor phase growth temperature.

Referring to a gallium arsenide phosphide $GaAs_{1-x}P_x$ epitaxial layer grown on the gallium phosphide GaP single-crystalline substrate, FIG. 5 shows relations between the vapor phase growth temperature required for maintaining a good surface quality of the epitaxial layer and the III -V partial pressure product of the source gas components to be supplied, as affected by the alloy composition "1-x" of gallium arsenide GaAs as a parameter. The III.V partial pressure product is defined as a product of partial pressure of a group III element component gas (GaCl) and that of group V element component gases ($AsH_3$ and $PH_3$), both of which being fed for proceeding vapor phase epitaxial growth.

The present inventors found out from analyses of these data shown in FIG. 5 that, to obtain the gallium arsenide phosphide $GaAs_{1-x}P_x$ alloy composition gradient layer 4 with a good surface quality and a good reproducibility, it was quite convenient to find an optimum III.V partial pressure product for a certain alloy composition and growth temperature desired at the end point of the growth of alloy composition increasing zones R11, R12 and R13, and then to determine supply volumes of the group III and group V gases so that such III.V partial pressure product is achieved.

For example, when the alloy composition "1-x" of gallium arsenide GaAs is 0 at a III.V partial pressure product and a growth temperature as Indicated by point C11, shift of the alloy composition "1-x" of gallium arsenide GaAs toward 0.13 is simply enabled by shifting the growth condition of the alloy composition increasing zone R11 from that indicated by point C11 to C12 to effect a jump-up of the III.V partial pressure product.

The successive growth of the alloy composition decreasing zone S11 is enabled by shifting the growth condition from that indicated by point C12 to C21 to moderately decrease the III V partial pressure product to a value same as that given by conditional point C11, and at the same time by moderately lowering the growth temperature, thereby the alloy composition "1-x" of gallium arsenide GaAs is decreased from 0.13 to 0.11. The reason why the alloy composition "1-x" of gallium arsenide GaAs is partially recovered instead of If being remained unchanged at 0.13 is that to enable relaxation of local stress caused by a rapid increase in the alloy composition in the alloy composition increasing zone R11 with aid of such decrease in the alloy composition.

An additional merit is obtained by such partial recovery of the alloy composition "1-x" of gallium arsenide GaAs from 0.13 to 0.11 since it allows a small decrement of the growth temperature, which will result in a shorter period for lowering the growth temperature and, as a consequence, in an improved productivity. Inside parts such as a wafer holder used in a growth furnace are generally made of graphite or other materials with relatively high thermal capacity, whose temperature cannot be lowered in a short period. To form a plural set of the alloy composition increasing and decreasing zones within the gallium arsenide phosphide $GaAs_{1-x}P_x$ alloy composition gradient layer 4, procedures similar to those described above will be traced as C11→C12→C21→C22→C31→C32→C41, during which a sharp increase and moderate decrease in the III.V partial pressure product are repeated while a moderately decreasing trend in the growth temperature is maintained.

The sharp increase and moderate decrease in the III.V partial pressure product is implemented by making a sharp increase and a moderate decrease in the supply volume of arsine $AsH_3$, a source gas for arsenic As, while making a moderate decrease in the supply volume of phosphine $PH_3$, a source gas for phosphorus.

Figure 1:
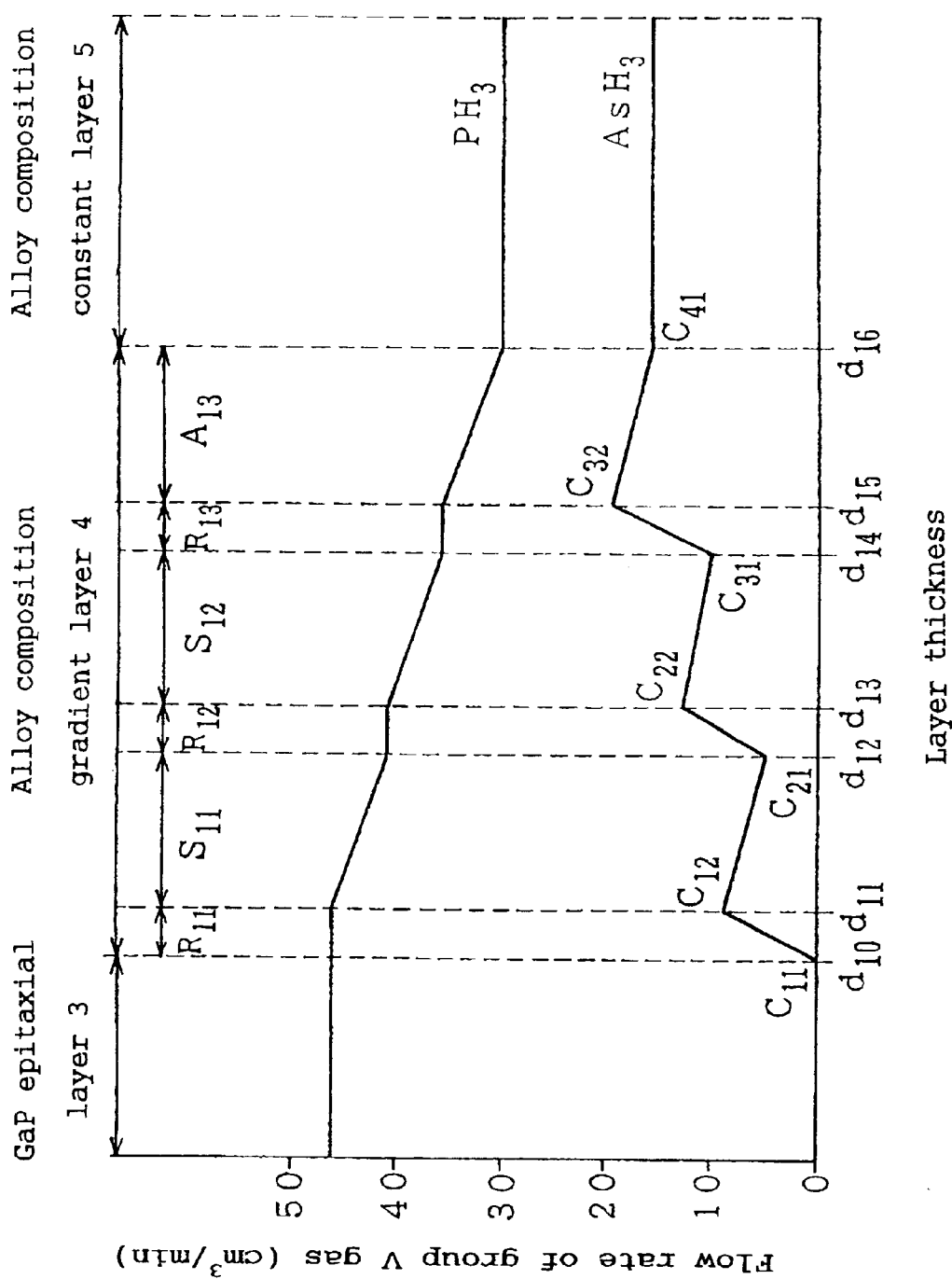
FIG. 1 shows a graph for explaining changes in supply volumes of the group V gases in one embodiment of a method for manufacturing compound semiconductor epitaxial wafer in accordance with the present invention.
Figure 2:
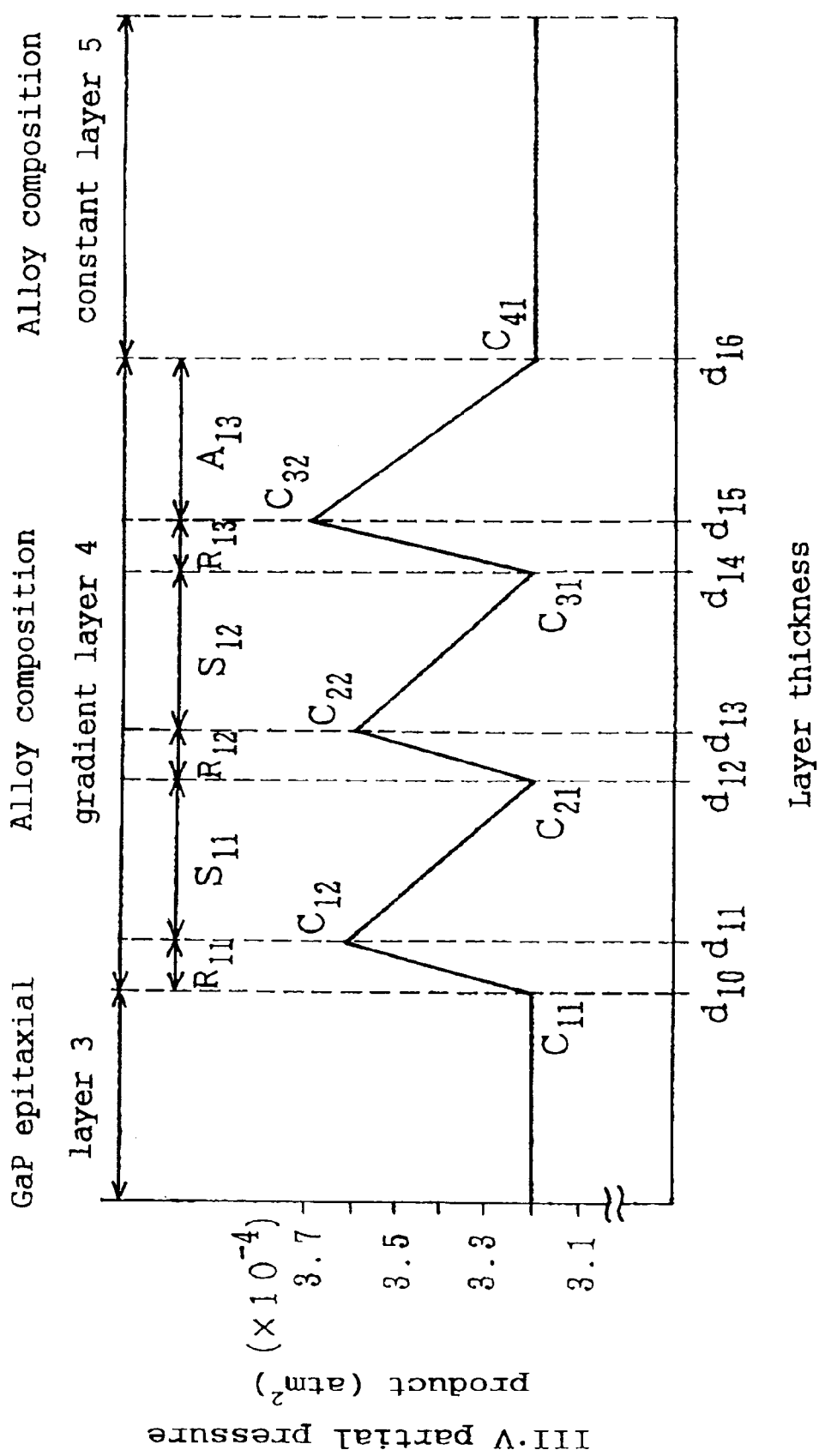
FIG. 2 shows a graph for explaining changes in the product of the group III and the group V gases in one embodiment of a method for manufacturing compound semiconductor epitaxial wafer in accordance with the present invention.
Figure 3:
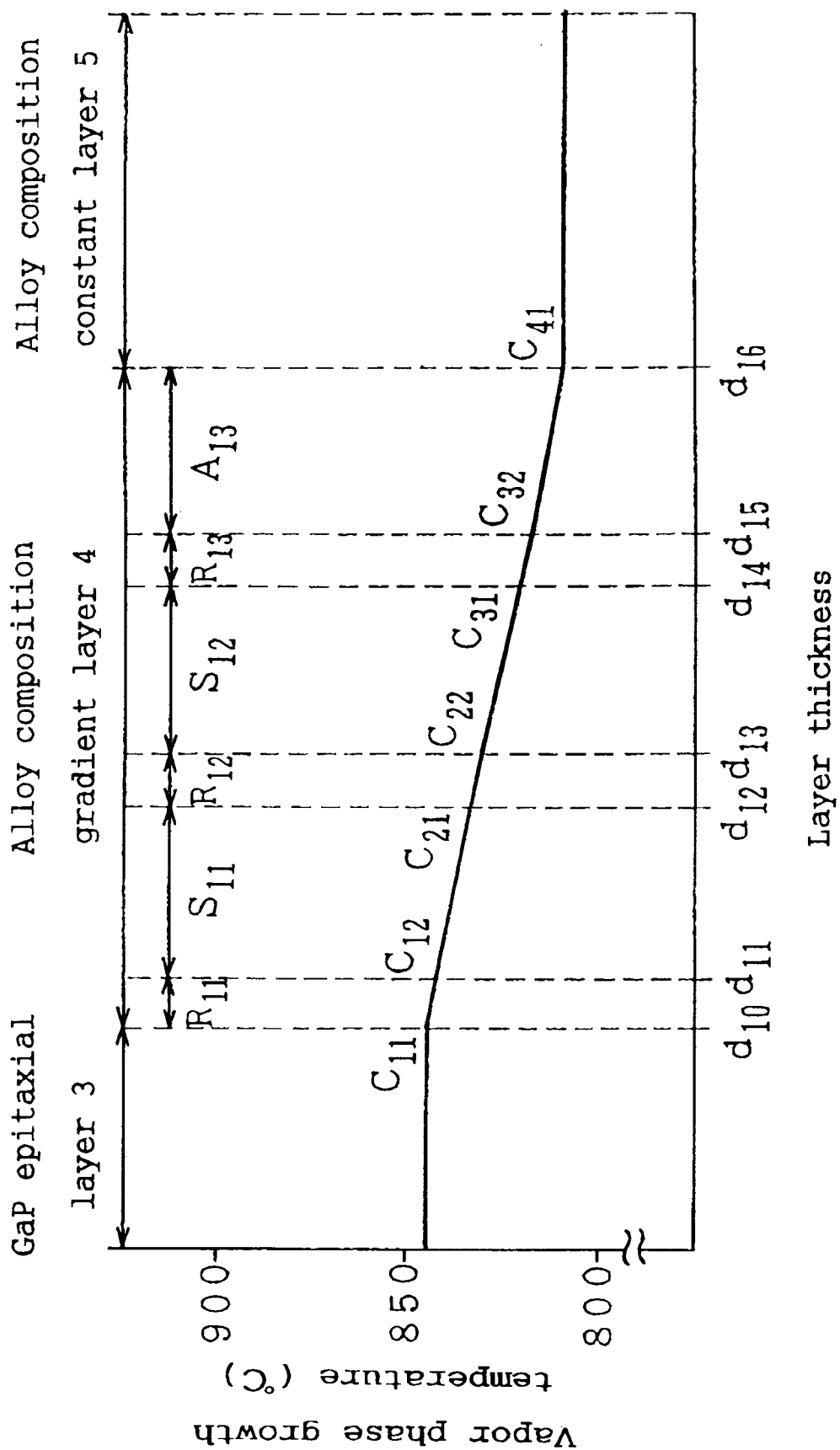
FIG. 3 shows a graph for explaining changes in the vapor phase growth temperature in one embodiment of a method for manufacturing compound semiconductor epitaxial wafer in accordance with the present invention.
Figure 4:
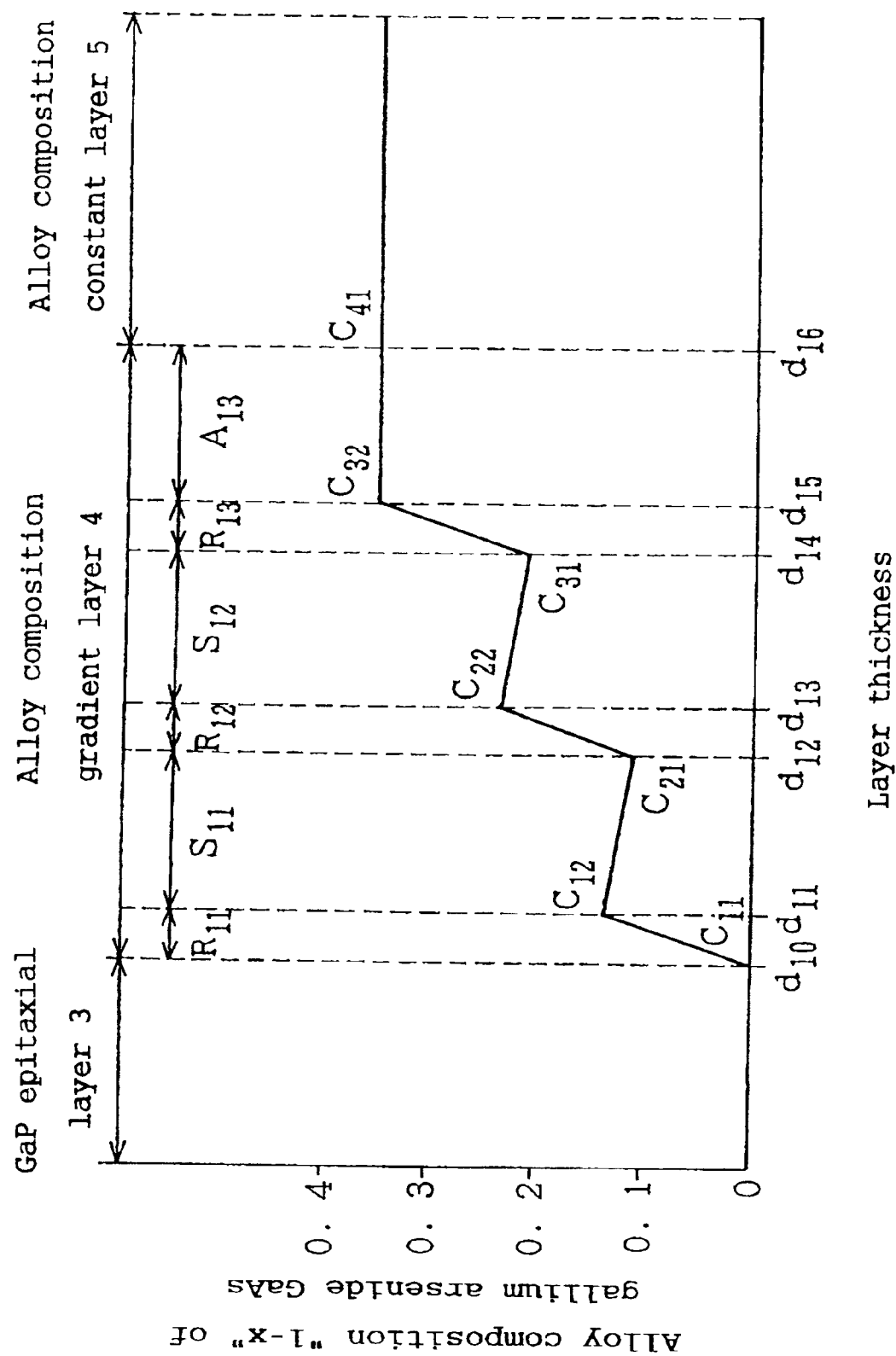
FIG. 4 shows a graph for explaining changes in the alloy composition "1-x" of gallium arsenide GaAs in one embodiment of a method for manufacturing compound semiconductor epitaxial wafer in accordance with the present invention.

Since the optimum III.V partial pressure product as shown in FIG. 2 is hard to attain if the supply volume of phosphine $PH_3$ is decreased during periods of the rapid increase in the supply volume of arsine $AsH_3$, it is more preferable in practice to keep a constant supply volume of the source gas containing group V element composing the substrate during periods of the rapid increase in the supply volume of arsine $AsH_3$.

The present invention will further be detailed with an example.

Example 1

An epitaxial wafer 1 for an orange light emitting diode, including a gallium arsenide phosphide $GaAs_{1-x}P_x$ alloy composition gradient layer 4 in which the alloy composition "1-x" of gallium arsenide GaAs ranges from 0 to 0.35 was manufactured according to the method described below.

An n-type gallium phosphide GaP single-crystalline ingot was sliced into a predetermined thickness, the slice was then subjected to chemical etching and mechanochemical polishing to obtain an approx. 300 μm-thick mirror-finished gallium phosphide GaP wafer, which was used as a gallium phosphide GaP single-crystalline substrate 2.

The gases used in the vapor phase growth include hydrogen $H_2$, hydrogen sulfide $H_2S$ diluted to 50 ppm with hydrogen, arsine $AsH_3$ diluted to 10% with hydrogen, phosphine $PH_3$ diluted also to 10% with hydrogen, and high purity hydrogen chloride HCl.

In a normal pressure vapor phase growth furnace, in which the n-type gallium phosphide GaP single-crystalline substrate 2 having i a diameter of 50 mm and a crystal orientation of (100) with an off-angle of 10° and a container filled with a high-purity gallium were properly positioned, hydrogen gas as a carrier gas was introduced at a flow rate of 2870 $cm^3$/min to thoroughly substitute the inner atmosphere of the vapor phase growth furnace with hydrogen, which was followed by temperature rising.

After the temperature of the gallium phosphide GaP single-crystalline substrate 2 reached 845° C., the high-purity hydrogen chloride HCl was fed at a flow rate of 92 cm/min to be reacted with the high-purity gallium placed in the container to generate gallium chloride GaCl, and concomitantly therewith hydrogen sulfide diluted to 50 ppm with hydrogen and phosphine $PH_3$ diluted to 10% also with hydrogen were fed at flow rates of 190 $cm^3$/min and 462 $cm^3$/min, respectively, to allow a growth on the gallium phosphide single-crystalline substrate 2 an n-type gallium phosphide GaP epitaxial layer 3 having a thickness $d_{10}$ of approx. 3 μm.

All epitaxial layers grown thereafter were doped with sulfur S in a similar manner to be made into n-type.

The III V partial pressure product applied to the growth of the above n-type gallium phosphide GaP epitaxial layer 3 is given by the equation 1 below:

$$\text{III·V partial pressure product} = \frac{\text{supply volume of group III gas}}{\text{total supply volume of all gases}} \times \frac{\text{supply volume of group V gases}}{\text{total supply volume of all gases}} \quad (1)$$

Since this example proceeds under the normal pressure (1 atm), the partial pressure of each gas numerically equals to its supply volume. And the supply volume of the group III gas used in this example is equivalent to that of hydrogen chloride HCl, here which is 92 $cm^3$/min. The group V gases involved in this example are phosphine $PH_3$ and arsine $AsH_3$, and only the hydrogen-diluted $PH_3$ is being fed in this stage at a flow rate of 462 $cm^3$/min. It should be noted that the net supply volume of the group V gas accounts for 10% of the above flow rate, which equals to 46.2 $cm^3$/min, since phosphine $PH_3$ is diluted to lot with hydrogen. The above flow rates are summed up with supply volumes of hydrogen and hydrogen sulfide, which are 2870 $cm^3$/min and 190 $cm^3$/min, respectively, to yield the total flow rate of all gases.

Thus the III.V partial pressure product for growing the n-type gallium phosphide GaP epitaxial layer 3 is given by $$92 \times 46.2 \div (92+462+2870+190)^2 = 3.25 \times 10^{-4} [\text{atm}]^2$$

On the gallium phosphide GaP epitaxial layer 3, a gallium arsenide phosphide $GaAs_{1-x}P_x$ in which the alloy composition "1-x" of gallium arsenide GaAs ranges from 0 to 0.35 was then grown according to the following procedures:

(Step 1) C11→C12

First, the flow rate of arsine $AsH_3$ diluted to 10% with hydrogen was sharply increased from 0 $cm^3$/min to 68 $cm^3$/min. During this period, the flow rate of phosphine $PH_3$ diluted to 10% with hydrogen was kept constant at 462 cm 3/min, so that the III.V partial pressure product is given by $$92 \times (46.2+6.8) \div (92+462+68+2870+190)^2 = 3.60 \times 10^{-4} [\text{atm}]^2$$

The III.V partial pressure product was so increased rapidly from $3.25 \times 10^{-4}$ to $3.60 \times 10^4$ $[\text{atm}]^2$ that the alloy composition increasing zone R11 having an alloy composition "1-x" of gallium arsenide GaAs sharply increasing from 0 to 0.13 and a thickness $(d_{11}-d_{10})$ of approx. 0.1 μm was successfully grown.

Provided that an increment of the alloy composition per 1 µm growth of the epitaxial layer is defined as increasing rate $\Delta x_1$ of the alloy composition, the increasing rate $\Delta x_1$ of the alloy composition "1-x" of gallium arsenide GaAs within the above zone will be approx. 1.3. Such increase in the alloy composition cannot be followed by growth temperature control only.

The above increasing rate $\Delta x_1$ ranging, in particular, between 0.1 to 20 is quite favorable since it can provide a high luminance of 5000 FtL (feet Lambert) or above.

The increasing rate $\Delta x_1$ smaller than 0.1, on the contrary, will cause less occurrence of misfit dislocation in the alloy composition increasing zone R11, so that stress ascribable to lattice mismatch and distributed along the direction of the epitaxial growth cannot effectively be relaxed.

On the other hand, the increasing rate $\Delta x_1$ larger than 20 will result in a lowered luminance since the crystal repair will become difficult even if the alloy composition is lowered in the alloy composition decreasing zone S11 as discussed next.

(Step 2) C12→C21

Here, the flow rate of arsine $AsH_3$ diluted to 10% with hydrogen was moderately decreased from 68 cm³/min to 48 cm³/min, and concomitantly with this, the flow rate of phosphine $PH_3$ also diluted to 10% with hydrogen was gradually reduced from 462 cm³/min to 414 cm³/min, so that the III.V partial pressure product was decreased moderately from $3.60 \times 10^{-4}$ to $3.25 \times 10^{-4}$ $[atm]^2$.

The growth temperature was gradually lowered from 845° C. to 835C during a period between points C11 and C21. Thus, the alloy composition decreasing zone S11 having the alloy composition "1-x" of gallium arsenide GaAs moderately declining from 0.13 to 0.11 and a thickness $(d_{12}-d_{11})$ of approx. 3 µm was successfully grown.

Provided that an decrement of the alloy composition per 1 µm growth of the epitaxial layer is defined as decreasing rate $\Delta x_2$ of the alloy composition, the decreasing rate $\Delta x_2$ of the alloy composition "1-x" of gallium arsenide GaAs within the above zone will be approx. 0.007.

When the above decreasing rate $\Delta x_2$ ranges between 0.005 to 0.05, an efficient repair of misfit dislocation generated in the alloy composition increasing zone R11 will be promised.

The decreasing rate $\Delta x_2$ smaller than 0.005 will, however, require too much thickness and thus ruin the productivity and luminance. The decreasing rate $\Delta x_2$ larger than 0.05 will also cause a lowered luminance due to insufficient repair of the crystal.

In this stage, a sum of the thicknesses of the alloy composition increasing zone R11 and alloy composition decreasing zone S11 is preferably selected between 1 to 10 µm. The thickness thinner than 1 µm may impair the crystallinity of the epitaxial layer, whereas thicker than 10 µm will not be very beneficial in terms of improving the productivity and luminance since the thickness of the alloy composition gradient layer 4 will be only comparable with that of the conventionals.

(Steps 3, 4, 5 and 6) C21→C22→C31→C32→C41

The similar vapor phase growth steps were repeated as briefed in Table 1, to obtain an alloy composition increasing zone R12 having an alloy composition "1-x" of gallium arsenide GaAs sharply increasing from 0.11 to 0.23 and a thickness $(d_{13}-d_{12})$ of approx. 0.1 µm (C21→C22), an approx. 3-µm-thick $(d_{14}-d_{13})$ alloy composition decreasing zone S12 showing a moderate decrease from 0.23 to 0.21 (C22→C31), an approx. 0.1-µm-thick $(d_{15}-d_{14})$ alloy composition increasing zone R13 showing a sharp increase from 0.21 to 0.35 (C31→C32), and an alloy composition adjusting zone A13 constant at 0.35 (C32→C41) in this order. Throughout these periods, the growth temperature was gradually lowered from 835° C. to 810C.

An alloy composition constant layer 5 having an alloy composition "1-x" of gallium arsenide GaAs of 0.35 and a thickness of 5 µm was further grown thereon, to complete the epitaxial layers 3, 4 and 5.

TABLE 1

| Timing | $C_{11}$ | $C_{12}$ | $C_{21}$ | $C_{22}$ | $C_{31}$ | $C_{32}$ | $C_{41}$ |
|---|---|---|---|---|---|---|---|
| Flow rate of $H_2$ (cm³/min) | 2870 | | | | | | |
| Flow rate of $H_2S$ (cm³/min) | 190 | | | | | | |
| Flow rate of HCl (cm³/min) | 92 | | | | | | |
| Flow rate of 10% $AsH_3$ (cm³/min) [Net flow rate of $AsH_3$] | 0 ↗ (0) | 68 ↘ (6.8) | 48 ↗ (4.8) | 125 ↘ (12.5) | 95 ↗ (9.5) | 185 ↘ (18.5) | 155 → (15.5) |
| Flow rate of 10% $PH_3$ (cm³/min) [Net flow rate of $PH_3$] | 462 → (46.2) | 462 ↘ (46.2) | 414 → (41.4) | 414 ↘ (41.4) | 367 → (36.7) | 367 ↘ (36.7) | 307 → (30.7) |
| Total flow rate (cm³/min) | 3614 | 3682 | 3614 | 3691 | 3614 | 3704 | 3614 |
| III-V partial pressure product ($\times 10^{-4} atm^2$) | 3.25 ↗ | 3.60 ↘ | 3.25 ↗ | 3.64 ↘ | 3.25 ↗ | 3.70 ↘ | 3.25 → |
| Growth temperature (°C.) | 845 | → | 835 | → | 835 | → | 810 → |
| Layers in alloy composition gradient layer | $R_{11}$ | $S_{11}$ | $R_{12}$ | $S_{12}$ | $R_{13}$ | $A_{13}$ | |
| Thickness (µm) | 0.1 | 3 | 0.1 | 3 | 0.1 | 3 | |

In the final stage, a 20-µm-thick alloy composition constant layer 4 having the same alloy composition as in the alloy composition constant layer 5 and doped with nitrogen N for creating an emission center was grown from the vapor phase, and the surface of which is further diffused with zinc Zn to form a p-type diffusion layer 7, thus an epitaxial wafer 1 in which three sets of stress-relaxing layers are serially formed along the growth direction was obtained.

Such epitaxial wafer 1 is attached with electrodes, diced into a proper size and enclosed in a package to be finished as a light emitting diode with a central emission wavelength of 629 nm.

What is claimed is:

1. A method for manufacturing compound semiconductor epitaxial wafer composing: a single-crystalline substrate made of gallium phosphide GaP or gallium arsenide GaAs; an alloy composition constant layer made of gallium arsenide phosphide $GaAs_{1-a}P_a$ (where, "1-a" represents alloy composition of gallium arsenide GaAs, and "a" represents alloy composition of gallium phosphide GaP and satisfies a relation of $0 \leq a \leq 1$); and an alloy composition gradient layer made of gallium arsenide phosphide $GaAs_{1-x}P_x$ (where, "1-x" represents alloy composition of gallium arsenide GaAs, and "x" represents alloy composition of gallium phosphide GaP and satisfies a relation of $0 \leq x \leq 1$) interposed between the single-crystalline substrate and the alloy composition constant layer, wherein the alloy composition gradient layer being epitaxially grown using a group III gas as a gallium Ga source and group V gases as arsenic As and phosphorus P sources, one of group V gases as a source for the group V element composing said single-crystalline substrate being gradually reduced as a whole in its supply volume, the other group V gas as a source for the group V element not composing said single-crystalline substrate being varied in its supply volume in at least one cycle of sharp increase/moderate decrease, thereby achieving at least one cycle of sharp increase/moderate decrease of a product of a partial pressure of said group III gas and a total of the partial pressures of said group V gases so that at least one set of an increasing zone and a decreasing zone of said alloy composition "1-x" or "x" is formed along the direction of the growth of said alloy composition gradient layer.

2. A method for manufacturing compound semiconductor epitaxial wafers as set forth in claim 1, wherein thickness of the one set of said alloy composition increasing zone and decreasing zone is set between 1 to 10 μm, both ends inclusive.

3. A method for manufacturing compound semiconductor epitaxial wafer as set forth in claim 1, wherein an increasing rate of said alloy composition "1-x" or "x" in the increasing zone per 1 μm of epitaxial growth thickness is set between 0.1 to 20, both ends inclusive, and a decreasing rate of said alloy composition "1-x" or "x" in the decreasing zone per 1 μm of epitaxial growth thickness is set between 0.005 to 0.05, both ends inclusive.

4. A method for manufacturing compound semiconductor epitaxial wafer as set forth in claim 3, wherein thickness of the one set of said alloy composition increasing zone and decreasing zone is set between 1 to 10 μm, both ends inclusive.

5. A method for manufacturing compound semiconductor epitaxial wafer as set forth in claim 1, wherein, at least during the period in which the supply volume of said group V gas is varied, the vapor phase growth temperature of said alloy composition gradient layer made of gallium arsenide phosphide $GaAs_{1-x}P_x$ is gradually lowered when the epitaxial growth is effected on said single-crystalline substrate made of gallium phosphide GaP, and gradually elevated when it is effected on said single-crystalline substrate made of gallium arsenide GaAs.

6. A method for manufacturing compound semiconductor epitaxial wafer as set forth in claim 5, wherein an increasing rate of said alloy composition "1-x" or "x" in the increasing zone per 1 μm of epitaxial growth thickness is set between 0.1 to 20, both ends inclusive, and a decreasing rate of said alloy composition "1-x" or "x" in the decreasing zone per 1 μm of epitaxial growth thickness is set between 0.005 to 0.05, both ends inclusive.

7. A method for manufacturing compound semiconductor epitaxial wafer as set forth in claim 6, wherein thickness of the one set of said alloy composition increasing zone and decreasing zone is set between 1 to 10 μm, both ends inclusive.

8. A method for manufacturing compound semiconductor epitaxial wafer as set forth in claim 5, wherein thickness of the one set of said alloy composition increasing zone and decreasing zone is set between 1 to 10 μm, both ends inclusive.

9. A method for manufacturing compound semiconductor epitaxial wafer as set forth in claim 1, wherein the supply volume of said group V gas as a source of the group V element composing said single-crystalline substrate is kept constant during a sharp increase in the supply volume of said group V gas as a source of the group V element not composing said single-crystalline substrate.

10. A method for manufacturing compound semiconductor epitaxial wafer as set forth in claim 9, wherein thickness of the one set of said alloy composition increasing zone and decreasing zone is set between 1 to 10 μm, both ends inclusive.

11. A method for manufacturing compound semiconductor epitaxial wafer as set forth in claim 9, wherein an increasing rate of said alloy composition "1-x" or "x" in the increasing zone per 1 μm of epitaxial growth thickness is set between 0.1 to 20, both ends inclusive, and a decreasing rate of said alloy composition "1-x" or "x" in the decreasing zone per 1 μm of epitaxial growth thickness is set between 0.005 to 0.05, both ends inclusive.

12. A method for manufacturing compound semiconductor epitaxial wafer as set forth in claim 11, wherein thickness of the one set of said alloy composition increasing zone and decreasing zone is set between 1 to 10 μm, both ends inclusive.

13. A method for manufacturing compound semiconductor epitaxial wafer as set forth in claim 9, wherein, at least during the period in which the supply volume of said group V gas is varied, the vapor phase growth temperature of said alloy composition gradient layer made of gallium arsenide phosphide $GaAs_{1-x}P_x$ is gradually lowered when the epitaxial growth is effected on said single-crystalline substrate made of gallium phosphide GaP, and gradually elevated when it is effected on said single-crystalline substrate made of gallium arsenide GaAs.

14. A method for manufacturing compound semiconductor epitaxial wafer as set forth in claim 13, wherein thickness of the one set of said alloy composition increasing zone and decreasing zone is set between 1 to 10 μm, both ends inclusive.

15. A method for manufacturing compound semiconductor epitaxial wafer as set forth in claim 13, wherein an increasing rate of said alloy composition "1-x" or "x" in the increasing zone per 1 μm of epitaxial growth thickness is set between 0.1 to 20, both ends inclusive, and a decreasing rate of said alloy composition "1-x" or "x" in the decreasing zone per 1 μm of epitaxial growth thickness is set between 0.005 to 0.05, both ends inclusive.

16. A method for manufacturing compound semiconductor epitaxial wafer as set forth in claim 8, wherein thickness of the one set of said alloy composition increasing zone and decreasing zone is set between 1 to 10 μm, both ends inclusive.

17. A method for manufacturing compound semiconductor epitaxial wafer as set forth in any one of claims 1–16 wherein an alloy composition adjusting zone is formed in the final stage of growing said alloy composition gradient layer, so that said alloy composition "1-x" or "x" is ultimately equalized to said alloy composition "1-a" or "a", respectively.

* * * * *